US006643807B1

(12) United States Patent
Heaslip et al.

(10) Patent No.: US 6,643,807 B1
(45) Date of Patent: Nov. 4, 2003

(54) ARRAY-BUILT-IN-SELF-TEST (ABIST) FOR EFFICIENT, FAST, BITMAPPING OF LARGE EMBEDDED ARRAYS IN MANUFACTURING TEST

(75) Inventors: Jay G. Heaslip, Williston, VT (US); Gary W. Maier, Burlington, VT (US); Gerard M. Salem, Essex Junction, VT (US); Timothy J. Von Reyn, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 09/629,507

(22) Filed: Aug. 1, 2000

(51) Int. Cl.[7] ............................................. G11C 29/00
(52) U.S. Cl. ...................................... 714/719; 714/723
(58) Field of Search ................................ 714/718, 719, 714/723

(56) References Cited

U.S. PATENT DOCUMENTS

| | | | |
|---|---|---|---|
| 4,876,685 A | | 10/1989 | Rich |
| 5,173,906 A | * | 12/1992 | Dreibelbis et al. .......... 714/733 |
| 5,325,367 A | | 6/1994 | Dekker et al. |
| 5,331,643 A | | 7/1994 | Smith |
| 5,383,195 A | * | 1/1995 | Spence et al. .............. 714/733 |
| 5,557,619 A | | 9/1996 | Rapoport |
| 5,568,437 A | * | 10/1996 | Jamal .......................... 365/201 |
| 5,640,354 A | | 6/1997 | Jang et al. |
| 5,689,466 A | | 11/1997 | Qureshi |
| 5,910,921 A | | 6/1999 | Beffa et al. |
| 5,961,653 A | | 10/1999 | Kalter et al. |
| 5,974,579 A | | 10/1999 | Lepejian et al. |
| 5,983,009 A | * | 11/1999 | Lepejian et al. ............... 716/18 |
| 6,067,262 A | * | 5/2000 | Irrinki et al. ................ 365/201 |
| 6,343,366 B1 | * | 1/2002 | Okitaka ....................... 714/733 |
| 6,496,947 B1 | * | 12/2002 | Schwarz ....................... 714/30 |

OTHER PUBLICATIONS

R.F. Kurth and A.O. Quintin, "Universal Physical Memory Bit Fail Map", Apr. 1984, pp. 5996–6000.
T.K. Jaber, "Array Built–In Self–Test With Diagnostic Logic," Jun. 1991, pp. 59–61.

* cited by examiner

Primary Examiner—Albert Decady
Assistant Examiner—C Britt
(74) Attorney, Agent, or Firm—McGinn & Gibb, PLLC; Robert A. Walsh, Esq.

(57) ABSTRACT

A structure and method for an integrated circuit which includes read/write memory having a plurality of memory devices, each of the memory devices having a unique address; a built-in self-test (BIST) engine, the BIST engine having a controller responsive to a test enable signal and operative to generate and store test data in the read/write memory; a comparator operative to compare retrieved data read from the read/write memory and the test data during a first pass test, the comparator identifying failed cycles where the retrieved data does not correspond correctly to the test data; and a diagnostic unit operative to store the failed cycles and being responsive to the controller generating and storing the test data in the read/write memory and operative to store failed data and failing addresses during a first pass test, wherein the BIST engine stops only at each of the failed cycles during the first pass test.

22 Claims, 2 Drawing Sheets

ARRAY-BUILT-IN-SELF-TEST (ABIST) FOR EFFICIENT, FAST, BITMAPPING OF LARGE EMBEDDED ARRAYS IN MANUFACTURING TEST

BACKGROUND OF THE INVENTION

1. Field of the Invention

The present invention relates to semiconductor integrated circuits and, more particularly, to test circuits built into the integrated circuits that enable efficient testing of embedded memory, especially read/write memory.

2. Description of the Related Art

As integrated circuits achieve higher and higher levels of integration it is common to find several memory blocks of differing sizes embedded within blocks of logic in the integrated circuit. A typical example of embedded memory is the data and instruction cache memories along with their associated tag and valid data cache memories that are embedded in most modem microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic. Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs. Testing of memories is generally accomplished by applying test vectors to the memory and reading back the results to ensure proper memory operation.

One possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden. To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used JTAG standards. Special test modes which disable the normal operation of the circuit are invoked to enable BIST. BIST attempts to provide complete fault coverage while minimizing test time and the area of the die that is occupied by the BIST circuitry. In some applications, it is also desirable that diagnostic information be available for faults that are detected. These requirements are in conflict, so various schemes have been developed which optimize one factor at the expense of the others.

One disadvantage of conventional BIST engines (e.g., macros), is the time necessary to test a memory array. For example, as disclosed in U.S. Pat. No. 5,568,437 to Jamal (hereinafter "Jamal"), incorporated herein by reference, a conventional BIST method and system are disclosed wherein the BIST engine stores and attempts to retrieve data from a memory array. If the data retrieved from the memory array does not match the data stored therein, the array contains one or more defects. The conventional BIST macro in Jamal determines which memory elements of the memory array are defective by stopping the BIST engine when an erroneous retrieval from the array is sensed. The address of the memory element is stored in a defect scan register and the BIST engine is reinitialized and the array testing is restarted from the previously located defective memory element until the next defective memory element is located. All addresses of the remaining defective memory elements are also added to the defect scan register. Once the BIST determines that no more defective memory elements are present, it outputs the addresses of the defective memory elements.

Therefore, with the conventional BIST macros, such as the one disclosed in Jamal, the BIST engine must be repeatedly reinitialized and the entire array is rechecked until all defective memory elements are located. This is a very time-consuming operation and takes on the order of minutes to test each chip. To the contrary, the invention described below provides a system where the BIST engine does not need to be restarted at each defective memory element. This reduces the time necessary to test an array to an order of milli-seconds per chip for single cell faults and seconds per chip for complete array wipe outs.

In addition, many faults occuring in today's technologies occur at speed. In Jamal's invention a real-time fail pin is used to monitor which tester cycle failed so a table of failing address's can be built to re-run the array BIST machine to each failing address for data collection. Due to tester buss speed limits and inherent internal logic design and tester latency's, it is impossible to run the array BIST at megahertz and gigahertz clock speeds to detect the AC faults. To do this, the invention uses on chip clock generation (OPCG) with a phase lock loop (PLL) to clock the array BIST at these high speeds. To map the failing array's with AC faults, the invention uses on chip BIST clock gating that immediately disables the clocks when the BIST compare circuitry detects a fail. The fail is then detected at the external tester pin a few cycles after it occurred. This allows the tester to run and detect fails at its slower speeds. The tester detects the fails and scans the diagnostic register for the failing address and data information. Upon a completion of the fail data collection, the tester asserts the internal BIST clock back on and continues to the next failing address. This inventive method of freezing the internal clocks on fail, preserves the BIST machine status so it can be restarted to the next failing address without restarting the BIST machine for each failing address and also allows for bitmapping at speed. Thus, with the invention, test time is reduced, test coverage is increased, and AC fault diagnosability is gained.

SUMMARY OF THE INVENTION

It is, therefore, an object of the present invention to provide a structure and method for an integrated circuit which includes a read/write memory having a plurality of memory devices, (each of the memory devices has a unique address), a built-in self-test (BIST) engine, (the BIST engine has a controller responsive to a test enable signal and operative to generate and store test data in the read/write memory), a comparator operative to compare retrieved data read from the read/write memory and the test data during a single pass test, (the comparator identifying failed cycles where the retrieved data does not correspond correctly to the test data), and a diagnostic unit operative to store the failed cycles and being responsive to the controller regenerating and re-storing the test data in the read/write memory and operative to store failed data and failing addresses, wherein the BIST engine stops only at each of the failed cycles during the single pass test. The BIST engine stops at each of the failed cycles and restarts without reinitailzing during the first pass test and performs only the first pass test. The diagnostic unit uses redundant registers within the integrated circuit which retrieves address and compare data, the read/write algorithm, and the test pattern being run on the failed memory devices when the BIST engine stops at each of the failed cycles.

The invention also comprises a method of operating a built in self test (BIST) engine upon read/write memory within an integrated circuit, including initializing the BIST engine; performing a single pass test on the integrated circuit failed cycles which includes stops at each of the failed cycles; and storing addresses of the failed memory devices during the stops.

BRIEF DESCRIPTION OF THE DRAWINGS

The foregoing will be better understood from the following detailed description of the preferred embodiments of the invention with reference to the drawings, in which.

DETAILED DESCRIPTION OF A PREFERRED EMBODIMENT OF THE INVENTION

The present invention is preferably embodied in an integrated circuit chip having logic, DRAM or SRAM embedded in the logic, and a BIST macro for testing the DRAM or SRAM. The embedded DRAM or SRAM is integral to a chip having a logic function, such as a complex gate array or standard cell, a microprocessor, a Digital Signal Processor (DSP), or an Application Specific Integrated Circuit (ASIC). The present invention logic chip may include one or more such embedded DRAMs and/or SRAMS.

Figure 1:
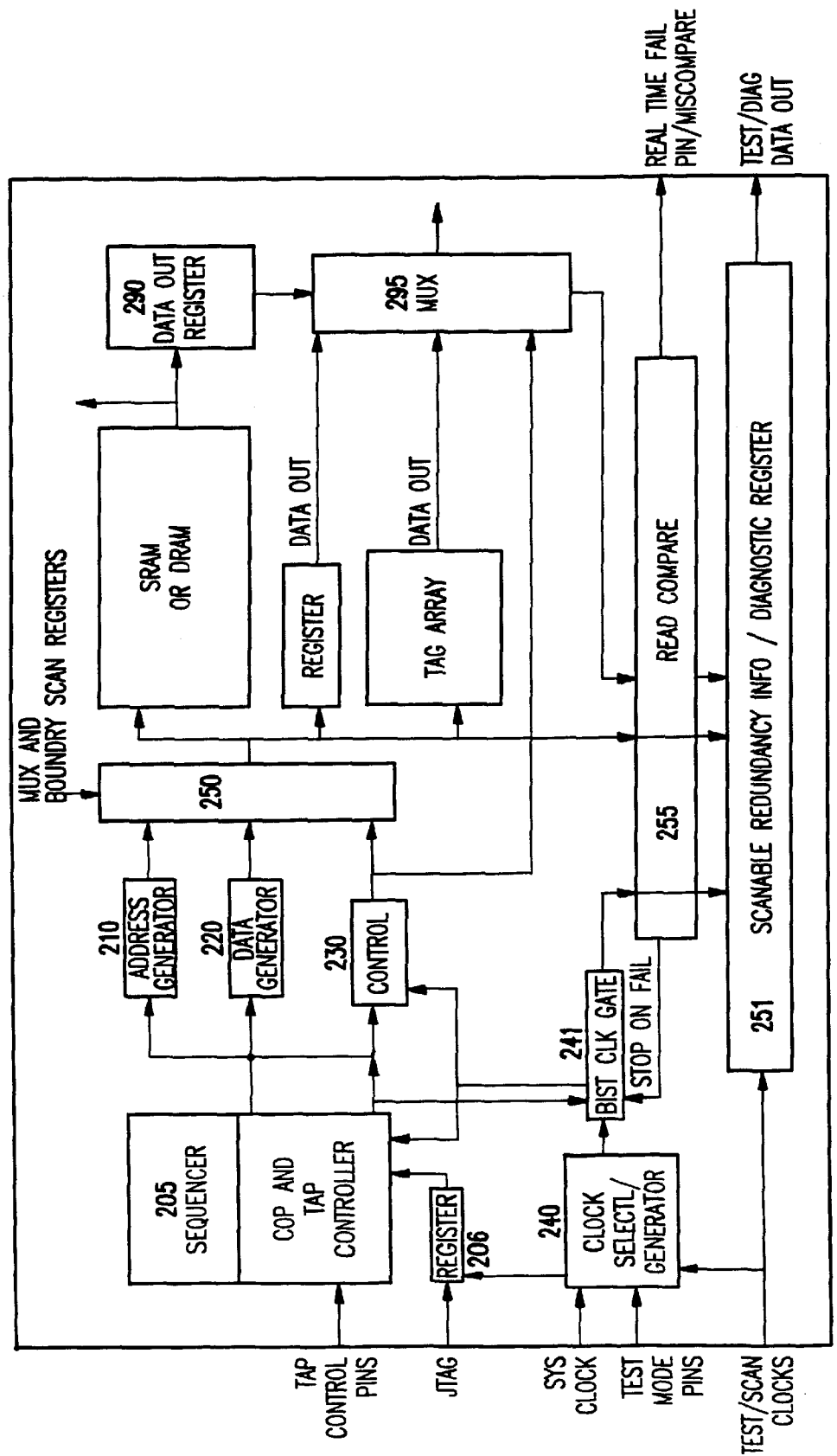
FIG. 1 is a logic block diagram of a BIST macro.

FIG. 1 is a logic block diagram of the BIST macro according to the present invention. The BIST block preferably includes a sequencer 205, an address generator 210, a data generator 220, a control block 230, a clock generator 240, a clock gate 241, a multiplexor to mux the address, data, and control to any embedded array 250, a read compare register 255 to compare the data read back from the arrays to the data written, a diagnostic register 251 to capture the compare output and failing address, and a Jtag interface 206 to load and initialize the BIST Sequencer/Controller 205.

In a preferred embodiment, the BIST sequencer 205 comprises an 8-bit sequence counter having branch control capabilities. The sequencer is designed to recognize a plurality of branches which include among others, an unconditional branch, conditional branches, branch-on-word or column address conditions, and the like. Additional branches provide loop capabilities within and without a test pattern. Each sequence fetches a test word from the Tap Controller 205 containing the information necessary to identify and execute a set of test instructions which collectively constitute a test pattern.

The address generator 210 preferably includes a column address counter, a row address counter, and a block address counter. The components of the address generator 210 can be used concurrently to provide address sequences used for test patterns such as: ripple row increment/decrement, ripple column increment/decrement, column disturbs, and the like. The data generator block 220 of the BIST is responsive to information transmitted by the Tap Controller 205 to create data inputs to the macro during BIST write cycles. It also creates comparison data for BIST read cycles, and bit write control inputs for the macro during BIST write cycles. The data-in and expected data-out generators 220 also produce either logical or physical I/Os, as indicated by the test bus for any given cycle. The data generator 220 also uses complementary data bits from the test bus. This adds to the flexibility of the design by allowing pattern loops to be written when only the read or write data state is changed.

The control block 230, under direction of the test bus, generates the control signals to the arrays that are appropriate for the particular type test pattern and cycle being applied, i.e., access mode, read/write, no-op, etc. The clock generator 240 is used to select the external clocks depending on the test mode, and to shape the functional clocks; i.e. multiply the system clock frequency. The front end of circuit 240 is responsive to the state of the system clock input or a test clock input. A test clock is provided for Jtag 206 command sequence loads to the Tap Controller 205 and to scan the failing data 251. As would be known by one ordinarily skilled in the art, given this disclosure, the options are, among others: a scan mode for LSSD testing and scanning BIST diagnostic fail data, BIST initialization using the Jtag interface, BIST Clocking, and normal operation/functional mode.

The boundary latch pipe stage 250 of FIG. 1, is the final stage of the BIST engine logic before buffering all the outputs from the BIST macro. Preferably, it is a master/slave latch attached to each output, thereby adding a pipeline stage to the BIST macro. This latch set also serves to provide boundary scan provisions for the BIST engine, thereby improving the overall test coverage. The latches comprising stage 250 may be advantageously connected to form a shift-register, to allow the register to scan-in and scan-out array control inputs.

Redundancy logic for repairing the failing arrays is also included in this design and many BIST designs. This was excluded from the drawings as it is beyond the scope of this invention. Large memory array architectures commonly have the ability to repair defective array storage cells. These elements have been practiced in various combinations of spare wordlines (or rows), spare bitlines (or columns), spare data bits and the like. Practitioners of the art will fully realize that many memory array defects can be repaired using a plurality of those redundant elements.

As discussed above, conventional BIST macros suffer from the disadvantage that the BIST engine must be reinitialized each time a defective memory element is encountered. When the read compare determines that the data-out from the register does not match the expected result (based upon the data-in from the data generator), a defective memory element has been found. With the invention, when such a condition occurs the compare logic 255 sends a signal to gate off the BIST clock 241 in that cycle as shown in FIG. 1. A few cycles later, the tester detects the fail at the real time fail pin. The test pattern instructs the tester to "branch on fail" to the scan vectors in that test pattern. The scan vectors switch the test mode to scan the failing array data and address.

After the scan cycles are complete, the tester returns to the test vectors it branched from, gates the BIST clock back on, and continues testing to the next failing address. The BIST machine status is preserved because it's data 220, control 230 and address 210 have not been scanned. Only the diagnostic register 251 contents has been scanned.

The diagnostic register 251 latches the failing block, word and way select, the wordline address, the read/write algorithm, and the data compare outputs to identify the failing bits on the failing wordline. Since the invention preserves the status of the BIST machine it can be restarted without re-intialization.

Generally, the address counter is out of sequence with the captured failing data and is a few cycles past where the fail occurred. This latency is pre-determined for each array and each design and the cylce offset is simply subtracted from the failing captured address to be syncronized with the failing captured data. Thus, the defective cycles=((failing address)–(the data compare to address cycle latency for each array and design)). The diagnostic unit 251 can be comprised of a set of dedicated registers or can be comprised of previously existing registers. In preferred embodiment, existing redundancy registers are used for the register 251 to preserve real estate. The diagnostic unit 251 simply latches the failing data, address, and control when a fail is detected in the compare unit 255.

In a preferred embodiment, the inventive BIST macro performs a first pass in diagnostic mode and sends a signal to the real-time-fail-pin for the selected array. This tells the tester a fail has occured, the BIST machine has stopped, and is waiting to have the diagnostic data unloaded. The tester unloads the data and restarts the BIST machine to the next failing address. The stop, unload, and restart sequence is continued until the entire array is tested and all the failing address and data is stored to tester fail memory. As mentioned above this is done without having to initlialize and restart the machine for each failing address.

Figure 2:
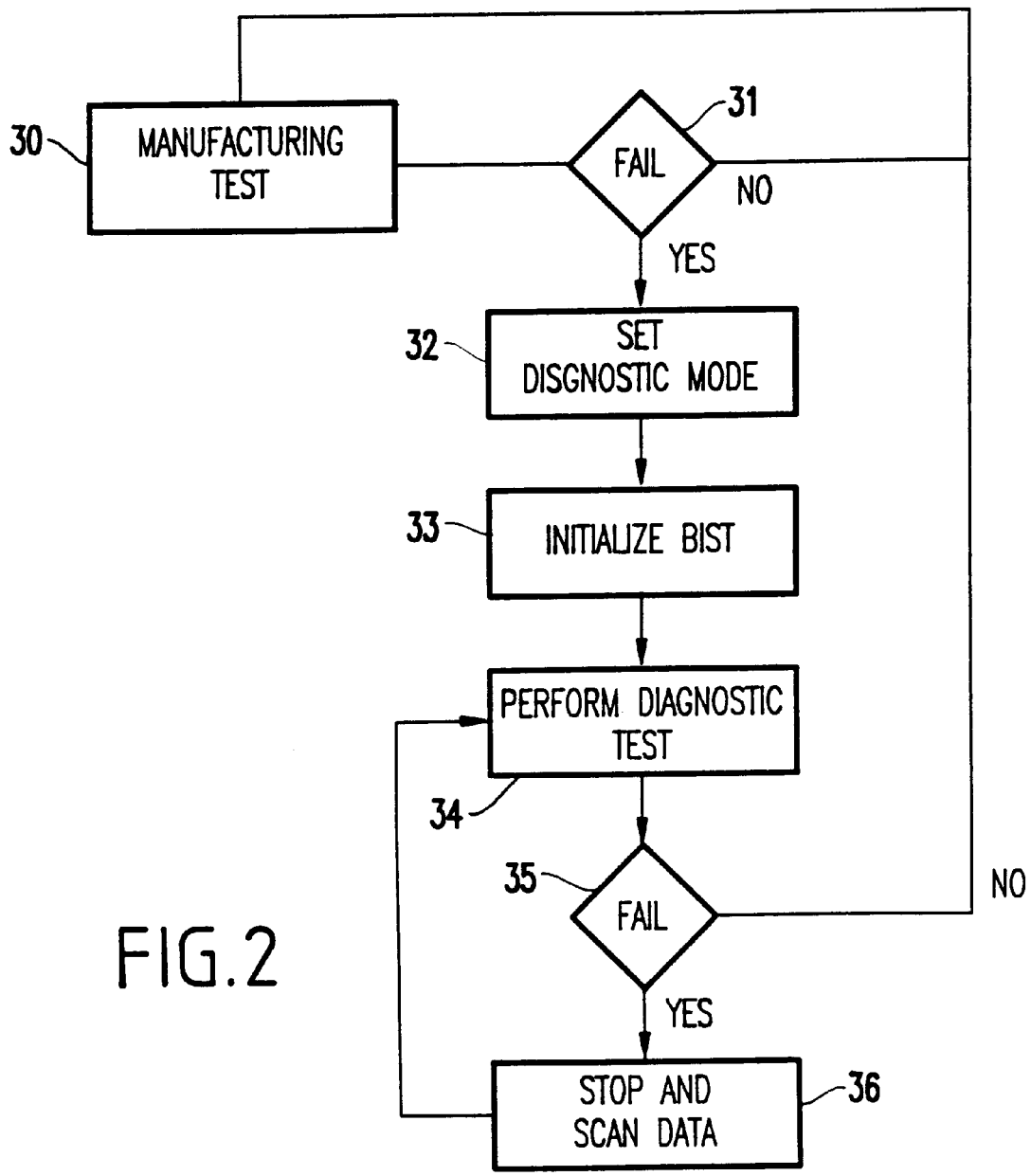
FIG. 2 is a flow diagram illustrating a preferred method of the invention.

This aspect of the invention is shown in flowchart form in FIG. 2. In item 30, the BIST is performed in normal manufacturing test. A manufacuring test flow is created to run the BIST machine in a very fast go-no/go mode to determine if an array on each die has failed. If it has failed, in item 31 the test program flow branches to a diagnostic flow which implements an array diagnostic pattern in item 32. This sets the diagnostic mode and selects the array, pattern, and algorithm to map. This selection is done via scanning special commands into the Cop and Tap controls 205 by setting test mode pins, generating the scan and test clocks, and manipulating the Tap Control pins which then initializes BIST in item 33. In item 34, the test pattern then changes the test mode and begins clocking the BIST machine which writes and reads the array. When a failing address is detected, in Item 35, the test pattern branches to the scan vectors which change the test mode to scan so the failing data and address can be unloaded from the diagnostic register 251 to tester fail memory. The test then returns to item 34 where the BIST clock is re-asserted and the the next address is tested. This sequence continues without BIST re-intialization, based on the real-time-fail-pin condition until the entire selected array is tested. A cycle count is set to stop at the end of testing the selected array.

The only memory tested in each bitmap cycle 34,35,36 is the one that failed in the normal manufacturing test 30. This is controlled by tester program flow control. Thus, the BIST stops only at the cycles where defects were noted and never requires re-inialization.

Many BIST designs require the tester failing cycle to be mapped to the internal memory address before one can produce the logical to physical bitmaps. This creates huge engineering overhead and requires new continuously changing algorithms and software support to generate bitmaps. In this invention, the data captured is the actual failing logical address and data of the embedded array. The data is then simply written to a physical map.

As mentioned above, this process reduces the test time from minutes per chip to milli-seconds per chip. This allows the invention to generate full bitmaps in the wafer final test, without exceeding test time budgets. Further, since the failing data and the full address are collected by the diagnostic unit 251, the need to convert relative addresses into physical addresses is eliminated and the engineering software overhead needed to decode failing tester addresses is substantially reduced.

In another embodiment, the invention avoids the need to perform two separate passes (e.g., by omitting the manufacturing test 30) and, instead, obtains all necessary addressing information in one single pass. This embodiment of the invention relies upon the ability to stop and restart the BIST macro, without reinitializing the BIST macro.

While the invention is described above with respect to a test engine for memory cells, as would be known by one ordinarily skilled in the art given this disclosure, the invention is not limited to such structures. Instead, the invention is equally applicable to testing all embedded arrays in micro-processors, ASICS, and systems-on-a-chip (SOC) designs. Many stand-alone SRAM and DRAM designs are now also being surrounded by logic which make it impossible to directly access the memory cells. This invention is useful in those applications as well. In summary, among other features, the invention allows efficient testing and diagnostics of any embedded array structure, reduces bitmap and test time by orders of magnitude which enables volume bitmaps to be generated in manufacturing final test for yield learning, allows diagnosis and bitmaps of AC and transition faults by allowing array bitmapping "at speed" (megahertz and gigahertz clock frequencies), and reduces engineering overhead by elimating the need to translate failing tester cycles to failing memory cycles before the logical to physical translation.

Having thus described our invention, what we claim as new and desire to secure by Letters Patent is as follows:

1. An integrated circuit comprising read/write memory having a plurality of memory devices, each of said memory devices having a unique address, and a built-in self-test (BIST) engine, said BIST engine comprising:

a controller responsive to a test enable signal and operative to generate and store test data in said read/write memory;

a comparator operative to compare retrieved data read from said read/write memory and said test data during a single pass test, said comparator identifying failed cycles where said retrieved data does not correspond to said test data;

a diagnostic unit operative to store said failed cycles and being operative to store failed data and failing address during said single pass test, wherein said BIST engine stops only at each of said failed cycles during said single pass test; and a BIST clock operative to receive signals from said comparator when said failed cycles are identified by said comparator, wherein said signals gate off said BIST clock thereby stopping said BIST engine at each said failed cycles.

2. The integrated circuit in claim 1, wherein said BIST engine stops at each of said failed cycles and restarts without reinitializing during said single pass test.

3. The integrated circuit in claim 1, wherein said BIST engine performs only said single pass test.

4. The integrated circuit in claim 1, wherein said diagnostic unit comprises redundant registers within said integrated circuit.

5. The integrated circuit in claim 1, wherein said diagnostic unit retrieves addresses of failed memory devices when said BIST engine stops at each of said failed cycles.

6. The integrated circuit in claim 5, wherein said diagnostic unit retrieves compare data, an algorithm and a test pattern being run relating to said failed memory devices when said BIST engine stops at each of said failed cycles.

7. A built-in self-test (BIST) engine comprising:
   a controller responsive to a test enable signal and operative to generate and store test data in read/write memory;
   a comparator operative to compare retrieved data read from said read/write memory and said test data during a single pass test, said comparator identifying failed cycles where said retrieved data does not correspond to said test data;
   a diagnostic unit operative to store said failed cycles and being operative to store failed data and failing address during said single pass test, wherein said BIST engine stops only at each of said failed cycles during said single pass test; and
   a BIST clock operative to receive signals from said comparator when said failed cycles are identified by said comparator, wherein said signals gate off said BIST clock thereby stopping said BIST engine at each said failed cycles.

8. The BIST engine in claim 7, wherein said BIST engine stops at each of said failed cycles and restarts without reinitializing during said single pass test.

9. The BIST engine in claim 7, wherein said BIST engine performs only said single pass test to determine addresses of all failures in said read/write memory.

10. The BIST engine in claim 7, wherein said diagnostic unit commprises redundant registers within an integrated circuit in which said BIST resides.

11. The BIST engine in claim 7, wherein said diagnostic unit retrieves addresses of failed memory devices when said BIST engine stops at each of said failed cycles.

12. The BIST engine claim 11, wherein said diagnostic unit retrieves compare data, an algorithm and a test pattern being run relating to said failed memory devices when said BIST engine stops at each of said failed cycles.

13. A method of operating a built-in self-test (BIST) engine upon read/write memory within an integrated circuit, said method comprising:
   initializing said BIST engine;
   performing a single pass test on said integrated circuit, said single pass including stops at each failed cycle;
   gating off a BIST clock on said integrated circuit when said each failed cycle is identified;
   stopping said BIST engine when said BIST clock is gated off; and
   storing addresses of failed memory devices during said stops.

14. The method in claim 13, wherein said BIST engine stops at each of said failed cycles and restarts without reinitializing during said single pass test.

15. The method in claim 13, wherein said BIST engine performs only said single pass test to determine addresses of all failures in said read/write memory.

16. The method in claim 13, wherein said storing of said addresses also includes storing compare data, an algorithm and a test pattern being run relating to said failed memory devices.

17. An integrated circuit comprising read/write memory having a plurality of memory devices, each of said memory devices having a unique address, and a built-in self-test (BIST) engine, said BIST engine comprising:
   a controller responsive to a test enable signal and operative to generate and store test data in said read/write memory;
   a comparator operative to compare retrieved data read from said read/write memory and said test data during a first pass test, said comparator identifying failed cycles where said retrieved data does not correspond correctly to said test data;
   a diagnostic unit operative to store said failed cycles and being responsive to said controller regenerating and re-storing said test data in said read/write memory and operative to store failed data and failing addresses during a second pass test, wherein said BIST engine stops only at each of said failed cycles during said second pass test; and
   a BIST clock operative to receive signals from said comparator when said failed cycles are identified by said comparator, wherein said signals gate off said BIST clock thereby stopping said BIST engine at each said failed cycles.

18. The integrated circuit in claim 17, wherein said BIST engine stops at each of said failed cycles and restarts without reinitializing during said second pass test.

19. The integrated circuit in claim 17, wherein said BIST engine performs only said first pass test.

20. The integrated circuit in claim 17, wherein said diagnostic unit comprises redundant registers with said intergrated circuit.

21. The integrated circuit in claim 17, wherein said diagnostic unit retrieves addresses of failed memory devices when said BIST engine stops at each of said failed cycles.

22. The integrated circuit in claim 21, wherein said diagnostic unit retrieves compare data, an algorithm and a test pattern being run relating to said failed memory devices when said BIST engine stops at each of said failed cycles.

* * * * *